(12) United States Patent
Levy et al.

(10) Patent No.: US 11,322,639 B2
(45) Date of Patent: May 3, 2022

(54) AVALANCHE PHOTODIODE

(71) Applicant: GLOBALFOUNDRIES U.S. INC., Santa Clara, CA (US)

(72) Inventors: Mark D. Levy, Williston, VT (US); Siva P. Adusumilli, South Burlington, VT (US); John J. Ellis-Monaghan, Grand Isle, VT (US); Vibhor Jain, Williston, VT (US); Ramsey Hazbun, Colchester, VT (US); Pernell Dongmo, Essex Junction, VT (US); Cameron E. Luce, Colchester, VT (US); Steven M. Shank, Jericho, VT (US); Rajendran Krishnasamy, Essex Junction, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 9 days.

(21) Appl. No.: 16/844,606

(22) Filed: Apr. 9, 2020

(65) Prior Publication Data
US 2021/0320217 A1    Oct. 14, 2021

(51) Int. Cl.
*H01L 31/107*    (2006.01)
*H01L 31/18*    (2006.01)
*H01L 31/028*    (2006.01)
*H01L 31/0376*    (2006.01)

(52) U.S. Cl.
CPC ........ *H01L 31/1075* (2013.01); *H01L 31/028* (2013.01); *H01L 31/03765* (2013.01); *H01L 31/1812* (2013.01)

(58) Field of Classification Search
None
See application file for complete search history.

(56) References Cited

U.S. PATENT DOCUMENTS

| 2,557,110 | A | | 6/1951 | Jaynes |
| 2,619,538 | A | | 11/1952 | Grant |
| 3,787,871 | A | | 1/1974 | Reese |
| 4,481,523 | A | * | 11/1984 | Osaka ............... H01L 31/1075 257/186 |
| 4,799,031 | A | | 1/1989 | Lang et al. |
| 6,147,349 | A | | 11/2000 | Ray |
| 6,180,945 | B1 | | 1/2001 | Barton et al. |

(Continued)

FOREIGN PATENT DOCUMENTS

KR    20100070610    6/2010

OTHER PUBLICATIONS

Application and Drawings for U.S. Appl. No. 16/935,854, filed Jul. 22, 2020.

(Continued)

*Primary Examiner* — Steven M Christopher
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to an avalanche photodiode and methods of manufacture. The structure includes: a substrate material having a trench with sidewalls and a bottom composed of the substrate material; a first semiconductor material lining the sidewalls and the bottom of the trench; a photosensitive semiconductor material provided on the first semiconductor material; and a third semiconductor material provided on the photosensitive semiconductor material.

19 Claims, 6 Drawing Sheets

(56) References Cited

U.S. PATENT DOCUMENTS

| | | | |
|---|---|---|---|
| 7,002,429 | B2 | 2/2006 | Asao et al. |
| 7,361,526 | B2 | 4/2008 | Maa et al. |
| 7,397,101 | B1 | 7/2008 | Masini et al. |
| 7,777,250 | B2 | 8/2010 | Lochtefeld |
| 7,790,495 | B2 | 9/2010 | Assefa et al. |
| 7,795,064 | B2 | 9/2010 | Pan et al. |
| 7,902,540 | B2 | 3/2011 | Cohen |
| 9,064,699 | B2 | 6/2015 | Wang et al. |
| 9,864,138 | B2 | 1/2018 | Coolbaugh et al. |
| 10,157,947 | B2 | 12/2018 | Chen et al. |
| 10,359,569 | B2 | 7/2019 | Dumais |
| 10,600,839 | B2 | 3/2020 | Kurokawa |
| 2003/0030814 | A1 | 2/2003 | Osinski et al. |
| 2007/0099315 | A1 | 5/2007 | Maa et al. |
| 2008/0070355 | A1 | 3/2008 | Lochtefeld et al. |
| 2011/0037133 | A1* | 2/2011 | Su .................. H01L 31/035281 257/432 |
| 2012/0213468 | A1 | 8/2012 | Lipson et al. |
| 2014/0159183 | A1 | 6/2014 | Na |
| 2014/0185979 | A1 | 7/2014 | Evans et al. |
| 2014/0217269 | A1 | 8/2014 | Guo et al. |
| 2015/0075599 | A1 | 3/2015 | Yu |
| 2015/0097256 | A1* | 4/2015 | Ang ........................ G02B 6/00 257/432 |
| 2015/0115333 | A1* | 4/2015 | Bobde .................. H01L 29/808 257/262 |
| 2016/0155884 | A1 | 6/2016 | Hon et al. |
| 2018/0204761 | A1 | 7/2018 | Feilchenfeld et al. |
| 2020/0020734 | A1* | 1/2020 | Wang ................ H01L 27/14612 |

OTHER PUBLICATIONS

Application and Drawings for U.S. Appl. No. 17/065,862, filed Oct. 8, 2020.
Application and Drawings for U.S. Appl. No. 16/741,792, filed Jan. 14, 2020, 38 pages.
Application and Drawings for U.S. Appl. No. 16/544,074, filed Aug. 19, 2020, 26 pages.
Application and Drawings for U.S. Appl. No. 16/887,375, filed May 29, 2020, 26 pages.
Application and Drawings for U.S. Appl. No. 16/531,819, filed Aug. 5, 2019, 25 pages.
Liao et al., "36 GHz submicron silicon waveguide germanium photodetector", Optics Express, vol. 19, Issue 11, May 20, 2011, 6 pages.
Huang et al., "Germanium on Silicon Avalanche Photodiode", IEEE Journal of Selected Topics in Quantum Electronics, vol. 24, No. 2, Mar./Apr. 2018, 11 pages.
Jutzi et al., "Ge-on-Si Vertical Incidence Photodiodes With 39-GHz Bandwidth", IEEE Photonics Technology Letters, vol. 17, Issue 7, Jul. 2005, 3 pages.
Koester et al., "Germanium-on-Insulator Photodetectors", IEEE, Oct. 2005, 3 pages.
Yu, "High-Efficiency p-i-n Photodetectors on Selective-Area-Grown Ge for Monolithic Integration", IEEE Electron Device Letters, vol. 30, Issue 11, Nov. 2009, 4 pages.
Knoll, "High-Performance BiCMOS Si Photonics Platform", IEEE, 2015, 9 pages.
Notice of Allowance in U.S. Appl. No. 16/531,819 dated Apr. 28, 2021, 9 pages.
Office Action in U.S. Appl. No. 16/887,375 dated Oct. 13, 2021, 13 pages.
Response to Office Action in U.S. Appl. No. 16/887,375 dated Jan. 13, 2022, 8 pages.

* cited by examiner

AVALANCHE PHOTODIODE

FIELD OF THE INVENTION

The present disclosure relates to semiconductor structures and, more particularly, to avalanche photodiodes and methods of manufacture.

BACKGROUND

An avalanche photodiode (APD) is a highly sensitive semiconductor photodiode that exploits the photoelectric effect to convert light into electricity. From a functional standpoint, the avalanche photodiode can be regarded as the semiconductor analog of photomultipliers. Typical applications for avalanche photodiodes are long-range fiber-optic telecommunication, and quantum sensing for control algorithms. Newer applications include positron emission tomography and particle physics.

Avalanche photodiode applicability and usefulness depends on many parameters. Two factors, for example, are quantum efficiency and total leakage. Quantum efficiency indicates how well incident optical photons are absorbed and then used to generate primary charge carriers; whereas, total leakage current is the sum of the dark current, photocurrent and noise.

Photodiode sensitivity is dependent on the length of the path of light through the photosensitive material and the ability of generated carrier pairs to reach the electrode/contact/cathode. In conventional structures, the carriers travel in a two dimensional pathway, e.g., vertically or laterally, which results in a long pathway. Due to the longer pathways of conventional avalanche photodiodes, there is a high frequency of photon recombination within the photosensitive material resulting in signal loss or weakening of the signal, itself. Moreover, the photosensitive material itself needs to be very thick, which is expensive and time consuming to grow, and which can make integration with other circuit elements more challenging.

SUMMARY

In an aspect of the disclosure, a structure comprises: a substrate material having a trench with sidewalls and a bottom comprising the substrate material; a first semiconductor material lining the sidewalls and the bottom of the trench; a photosensitive semiconductor material provided on the first semiconductor material; and a third semiconductor material provided on the photosensitive semiconductor material.

In an aspect of the disclosure, a structure comprising: a semiconductor material; a trench formed in the semiconductor material, the trench having sidewalls and a bottom; a semiconductor material having a first dopant type which lines the sidewalls and the bottom of the trench; an intrinsic photosensitive semiconductor material contacting the semiconductor material; a second semiconductor material having the first dopant type and which is in the trench and contacting the intrinsic photosensitive semiconductor material; and an isolation structure comprising reflective material surrounding the trench, and remotely positioned from the intrinsic photosensitive semiconductor material.

In an aspect of the disclosure, a method comprising: forming a trench in a substrate; providing a liner of semiconductor material on sidewalls and a bottom of the trench; forming an undoped photosensitive material on the semiconductor material within the trench; forming another semiconductor material on the undoped photosensitive material, within an outside of the trench; and forming trench structures with reflective material in the substrate adjacent to the liner of the semiconductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to avalanche photodiodes and methods of manufacture. More specifically, the present disclosure is directed to structures and methods of forming concentric shaped (or other shaped) avalanche photodiodes. Advantageously, the avalanche photodiodes described herein exhibit increased sensitivity due to a particular form factor, e.g., circular, in addition to dense packing of cells and improved reflection. Moreover, the avalanche photodiodes can be integrated with other devices using established/existing processes.

In more specific embodiments, the avalanche photodiodes are formed in a trench having sidewalls and a bottom composed of exposed semiconductor material. A semiconductor material such as silicon is provided along the sidewalls and bottom of the trench to enhance the growth of a photosensitive material, e.g., germanium (Ge) layer, compared to having oxide on the sidewalls which inhibit growth of Ge material on the sidewalls. That is, in the structures presented herein a Ge layer is grown from a both bottom and sidewalls of the trench, instead of only the bottom of the trench.

In embodiments, by implementing the structures herein, a layered epitaxial growth (versus a solid Ge mass) can be used to create a shorter three dimensional (3D) path for generated carriers (versus a strictly linear path), thereby reducing the risk of carrier recombination before detection. In further embodiments, a polyfilm stack is grown inside the trench in layers from the bottom and outside with a P+ plug in the center of structure to provide biasing for operation of the avalanche diode.

The avalanche photodiodes of the present disclosure can be manufactured in a number of ways using a number of different tools. In general, though, the methodologies and tools are used to form structures with dimensions in the micrometer and nanometer scale. The methodologies, i.e., technologies, employed to manufacture the avalanche photodiodes of the present disclosure have been adopted from integrated circuit (IC) technology. For example, the structures are built on wafers and are realized in films of material patterned by photolithographic processes on the top of a wafer. In particular, the fabrication of the avalanche photodiodes use three basic building blocks: (i) deposition of thin films of material on a substrate, (ii) applying a patterned mask on top of the films by photolithographic imaging, and (iii) etching the films selectively to the mask.

Figure 1:
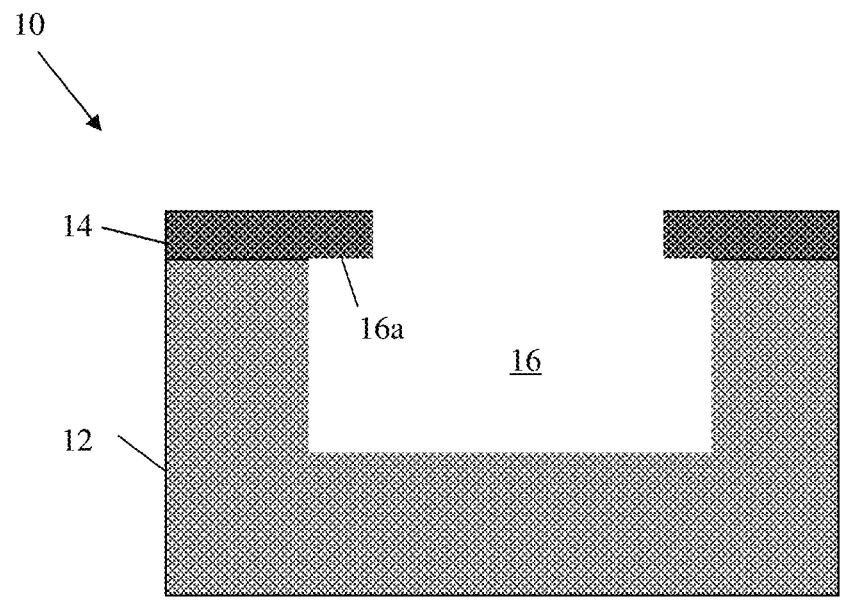
FIG. 1 shows a substrate with a trench, amongst other features, and respective fabrication processes in accordance with aspects of the present disclosure.

FIG. 1 shows a substrate with a trench, amongst other features, and respective fabrication processes in accordance with aspects of the present disclosure. More specifically, the structure 10 includes a substrate 12. The substrate 12 can be representative of a CMOS chip, for example. In embodiments, the substrate 12 is preferably Si material; although other semiconductor materials are contemplated herein. For example, the substrate 12 can be composed of any suitable material including SiC, GaAs, InAs, InP, and other III/V or II/VI compound semiconductors. In preferred embodiments, the substrate 12 is a N-type substrate composed of a single semiconducting material such as bulk silicon; although, as described with respect to FIG. 9, for example, the substrate 12 can be a P-type substrate.

A hardmask 14 is deposited on the substrate 12. In embodiments, the hardmask 14 can be nitride or other hardmask material as is known in the art such that no further explanation is required for a complete understanding of the present disclosure. The hardmask 14 can be deposited by known deposition methods such as, e.g., chemical vapor deposition (CVD) process. The hardmask 14 will prevent epitaxial growth of semiconductor material on a surface of the substrate 12 in subsequent processes.

Still referring to FIG. 1, a trench 16 is formed in the substrate 12 using conventional lithography and etching processes known to those of skill in the art. In one non-limiting example, the trench 16 can have a depth of about 2.5 µm (although other dimensions are contemplated herein). In forming the trench 16, a resist formed over the hardmask 14 is exposed to energy (light) to form a pattern (opening). An etching process with a selective chemistry, e.g., reactive ion etching (RIE), will be used to form one or more trenches 16 in the substrate 12 through the hardmask 14 and openings of the resist. As described with respect to FIGS. 5A and 5B, the trench 16 can be of many different configurations, e.g., round, square, etc. A HF clean can follow the etching process to remove contaminants from the surfaces of the trench 16, thereby ensuring a clean surface of exposed semiconductor material of the bottom surface and sidewalls of the trench 16. The resist can be removed by a conventional oxygen ashing process or other known stripants.

Due to the selectivity of the chemistries during the etching process, the substrate 12 can be laterally etched under the hardmask 14, relative to the opening of the hardmask 14. By having the lateral recess, an overhang 16a of hardmask 14 will be formed over the trench 16. The overhang 16a will pin dislocations, maintain a separation between materials, and avoid pinch-off and improve epitaxial growth in subsequent processes.

Figure 2:
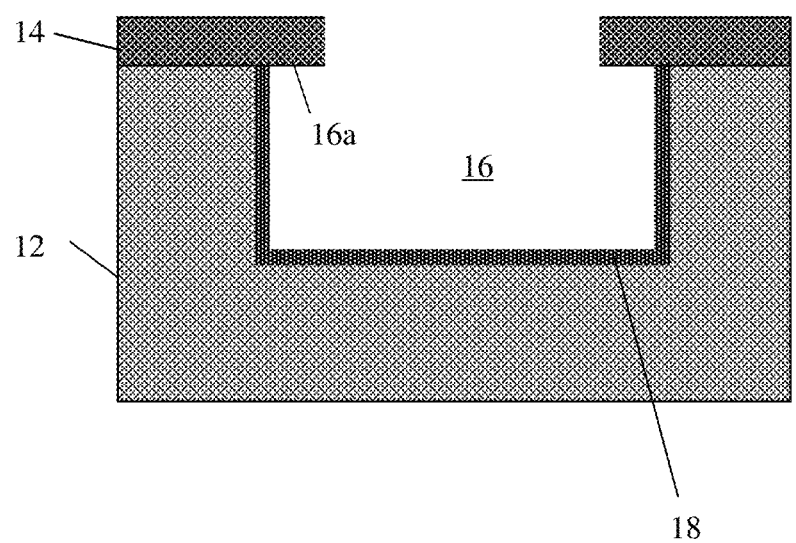
FIG. 2 shows a semiconductor material lining both a bottom surface and sidewalls of the trench, amongst other features, and respective fabrication processes in accordance with aspects of the present disclosure.

In FIG. 2, a semiconductor material 18 is grown on both the bottom surface and sidewalls of the trench 16, under the overhang 16a. In embodiments, the semiconductor material 18 is a liner that is formed by a selective epitaxial growth process starting from the exposed semiconductor material on both the sidewalls and bottom surface of the trench 16. The semiconductor material 18 can be grown in annular rings, as an example. As should be understood by those of ordinary skill in the art, the hardmask 14 will prevent growth of semiconductor material on a surface of the substrate 12 outside of the trench 16. The semiconductor material 18 will be a P-type semiconductor material, preferably composed of the same material as the substrate 12, e.g., Si. In alternative embodiments, the semiconductor material 18 can be a different material such as SiGe.

Figure 3:
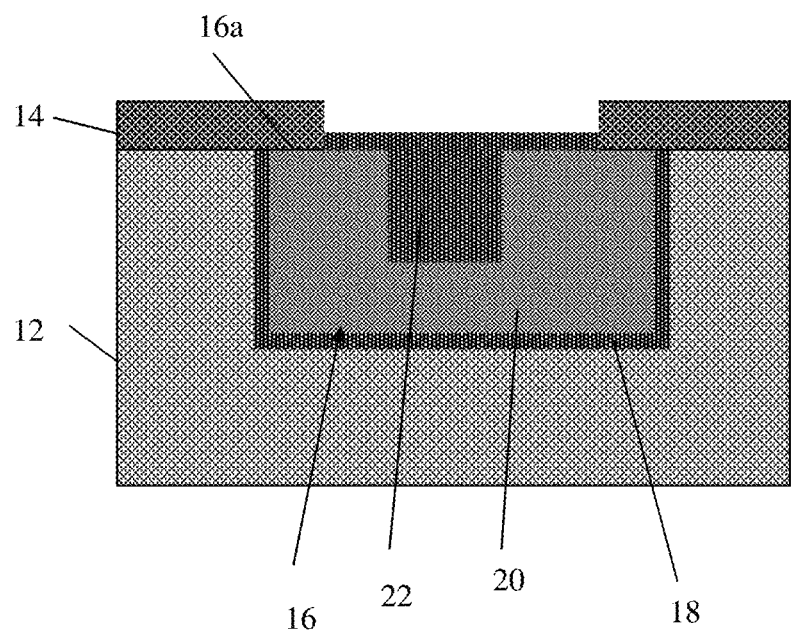
FIG. 3 show additional semiconductor materials in the trench used to form a photodiode and respective fabrication processes in accordance with aspects of the present disclosure.

As shown in FIG. 3, an additional semiconductor material 20 is selectively grown on the semiconductor material 18. In embodiments, the additional semiconductor material 20 is an intrinsic photosensitive semiconductor material (non-doped) formed by an epitaxial growth process. The semiconductor material 20 is preferably Ge material to offer superior responsivity, and is thicker than the liner composed of the semiconductor material 18. In alternative embodiments, the semiconductor material 20 can be Si, SiGe, etc. A semiconductor material 22 is then grown in the remaining portions of the trench 17, over the semiconductor material 20. The semiconductor material 22 will also grow on the upper, exposed surface of the semiconductor material 20. The semiconductor material 22 is preferably the same material as that of the semiconductor material 18. For example, the semiconductor material 22 is a P+ type semiconductor material or polysilicon.

In embodiments, the semiconductor material 22 is a P+ plug in the center of structure to provide biasing for operation of the avalanche photodiode. In this way, a N-P-I-P photodiode 25 can be formed. More specifically, the P+ material, e.g., semiconductor material 22, in center of the photodiode 25 and the P+ material (e.g., semiconductor material 18) on the sides and bottom of the SiGe material (e.g., semiconductor material 20) create an avalanche photodiode (APD) which is biased in three dimensions, increasing the likelihood of picking up a signal before carrier recombination.

Figure 4:
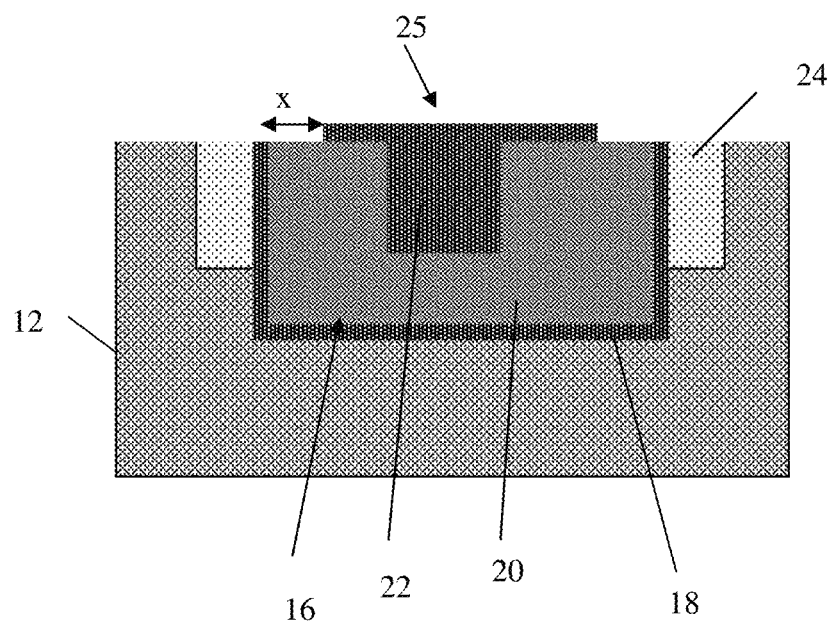
FIG. 4 shows a shallow trench isolation structure about the photodiode and respective fabrication processes in accordance with aspects of the present disclosure.

In FIG. 4, the hardmask is now removed by a selective etching process. In embodiments, the removal of the hardmask will leave a space "x" between the semiconductor material 22 and an edge of the trench 16 (e.g., photodiode 25). A shallow trench isolation structure or deep oxide filled/lined trench 24 is formed around the now filled trench 16 (e.g., photodiode 25). In embodiments, the shallow trench isolation structure or deep oxide filled/lined trench 24 should be spaced away from the intrinsic material, e.g., Ge material 20, to avoid damage to such materials and, hence, reduce any possibility of trapping of the photons. Also, the shallow trench isolation structure or deep oxide filled/lined trench 24 can be of various depths, including below the depth of the trench 16 (e.g., photodiode 25), depending on the performance parameters.

The shallow trench isolation structure or deep oxide filled/lined trench 24 can be fabricated by conventional lithography, etching and deposition methods. For example, a resist formed over the substrate 12 and photodiode 25 is exposed to energy (light) to form a pattern (opening). An etching process with a selective chemistry, e.g., RIE, will be used to form one or more trenches in the substrate 12, on the side of the photodiode 25. Following the resist removal, an insulator material (e.g., oxide) can be deposited by any conventional deposition processes, e.g., CVD processes. Any residual material on the surface of the substrate 12 can be removed by conventional chemical mechanical polishing (CMP) processes.

Figure 5:
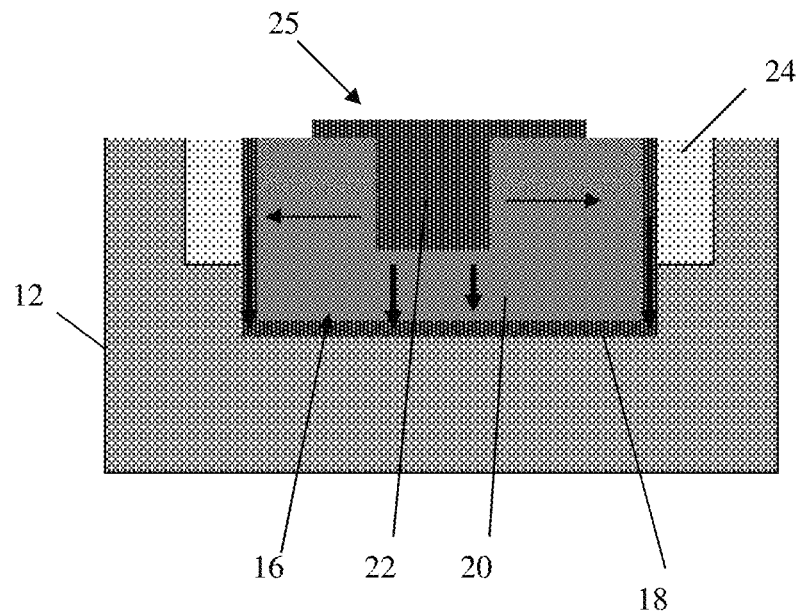
FIG. 5 shows carrier pathway in the photodiode in accordance with aspects of the present disclosure.

As shown representatively in FIG. 5, photons enter the photodiode 25 and create carriers in the intrinsic material which travel through the intrinsic semiconductor material 20 (e.g., Ge material) to the semiconductor material 18 on all sides (e.g., as represented by the arrows). In this way, the photodiode 25 has a three dimensional current flow. By having the three dimensional current flow, the carrier path to the substrate 12 or more accurately through the semiconductor material (p-material) 18 to the substrate (N-type material) 12 is much shorter (compared to known photodiodes which have a path from top to bottom) since the intrinsic semiconductor material 20 is surrounded on its sides and bottom by the semiconductor material 18. And, by having a shorter path, it is less likely that the carriers will recombine resulting in a loss of signal strength.

Also, the shallow trench isolation structure or deep oxide filled/lined trench 24 will act as a reflector or mirror so as to restrain the light from entering the substrate 12 on sides of the trench; instead, effectively pushing any light (photons) towards the liner 18 and into the substrate 12. Said otherwise, the shallow trench isolation structure or deep oxide filled/lined trench 24 formed around the outside of photodiode 25 provides a reflective interface to maximize incident photon interaction with the intrinsic semiconductor material 20 for carrier generation, e.g., provide reflective surface to increase photon resident time in the Ge material.

Figure 6A:
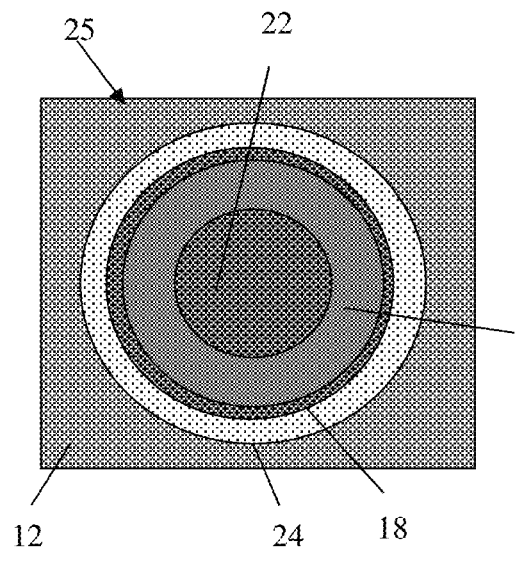
FIGS. 6A and 6B show different shapes of the photodiode in accordance with aspects of the present disclosure.
Figure 6B:
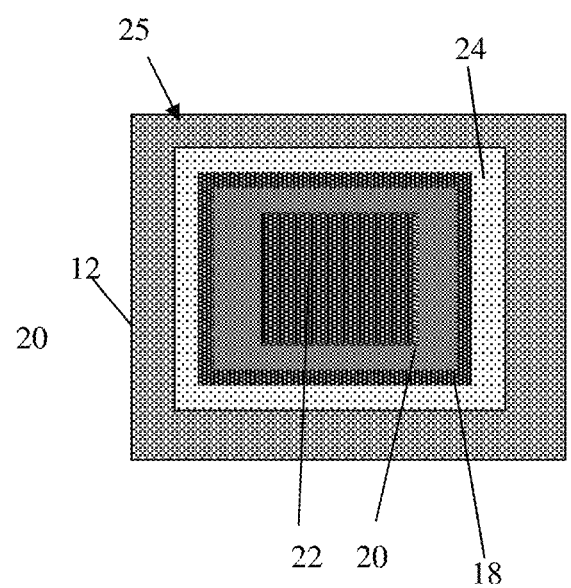

FIGS. 6A and 6B show different cross-sectional shapes of the photodiode 25. For example, in FIG. 6A, the cross-sectional profile of the photodiode 25 is circular (columnar); whereas, in FIG. 6B, the cross-sectional profile of the photodiode 25 is quadrilateral (e.g., square). It should be understood, though, that other profiles are also contemplated herein such as, but not limited to, bars, rectangle, oval, octagonal, etc.

Figure 7:
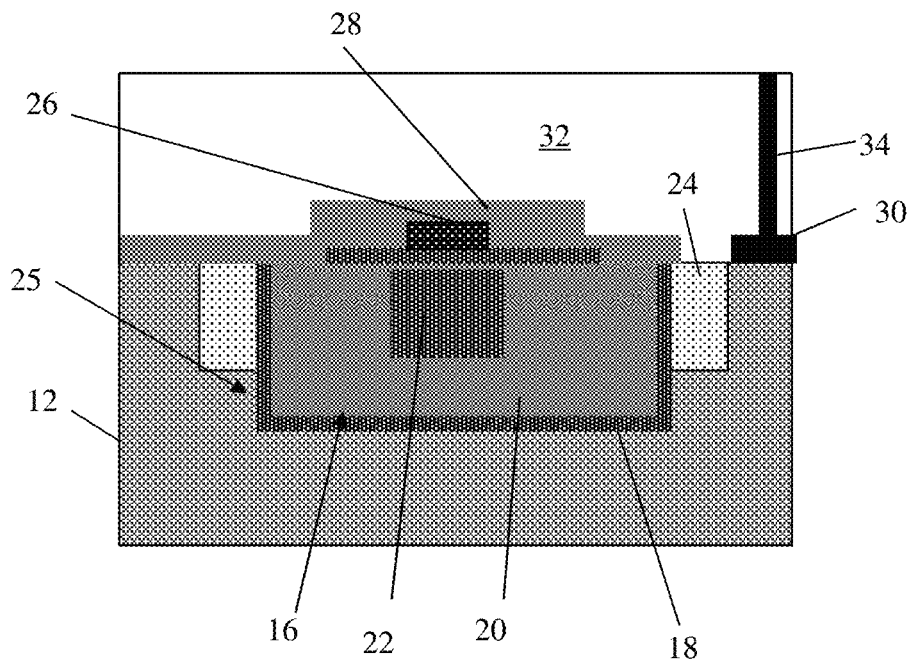
FIG. 7 shows contact formation to the photodiode, amongst other features, and respective fabrication processes in accordance with aspects of the present disclosure.

FIG. 7 shows contact formation to the photodiode, amongst other features, and respective fabrication processes. In FIG. 7, a semiconductor material 26, e.g., polysilicon, is formed on the top side of the photodiode 25. The semiconductor material 26 will act as a contact to the top of the semiconductor material 26 (e.g., P+ plug of the photodiode 25). More specifically, the semiconductor material 26 will bring in a driving current to the photodiode 25 to bias the bias the plug 22 and drive carriers from the center of the photodiode 25 (e.g., semiconductor material 20) towards the outside of the photodiode 25, (e.g., liner of semiconductor material 18). In this way, the drive current will effectively amplify the signal.

A film 28, e.g., nitride or other hardmask material, will cover or isolate the semiconductor material 26 to prevent silicide forming on the top of the photodiode 25. The unsilicided top surface will provide optimal performance under front-side illumination of the photodiode 25.

A silicide contact 30 is formed on an exposed surface of the substrate 12, on a side of the photodiode 25. As should be understood by those of skill in the art, the silicide process begins with deposition of a thin transition metal layer, e.g., nickel, cobalt or titanium, over the semiconductor material of the substrate 12. After deposition of the material, the structure is heated allowing the transition metal to react with exposed silicon (or other semiconductor material as described herein) forming a low-resistance transition metal silicide. Following the reaction, any remaining transition metal is removed by chemical etching, leaving the silicide contacts 30.

Still referring to FIG. 7, an interlevel dielectric material (e.g., oxide) 32 is deposited over the structure. A trench is formed in the interlevel dielectric material (e.g., oxide) 32, aligned with and exposing a top surface of silicide contact 30. The trench is formed by conventional lithography and etching processes as already described herein. The trench is filled with a metal material, e.g., tungsten, to form a contact 34. As should be understood by those of skill in the art, the contact 34 is used to detect the current generated by the photons hitting the photodiode 25 (e.g., semiconductor material 20 of the photodiode 25).

Figure 8:
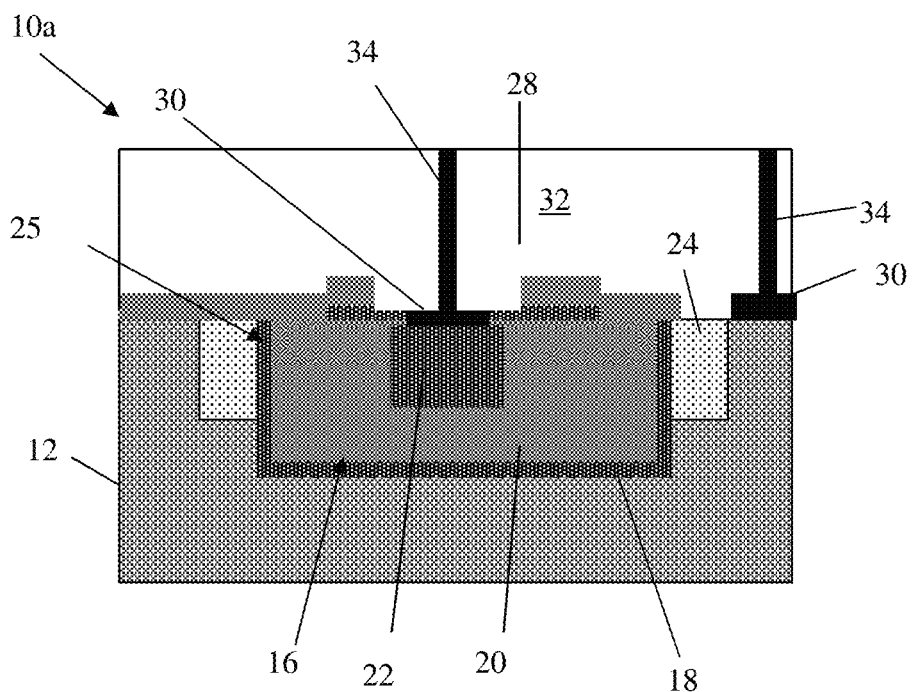
FIG. 8 shows a photodiode in accordance with additional aspects of the present disclosure.

FIG. 8 shows a photodiode in accordance with additional aspects of the disclosure. More specifically, in the structure 10a of FIG. 8, a silicide contact 30 is formed directly on a top surface of the photodiode 25, e.g., semiconductor material 22. This arrangement is suitable for backside illumination. Thereafter, a contact 34 is formed to the silicide contacts 30 as described with reference to FIG. 7.

Figure 9:
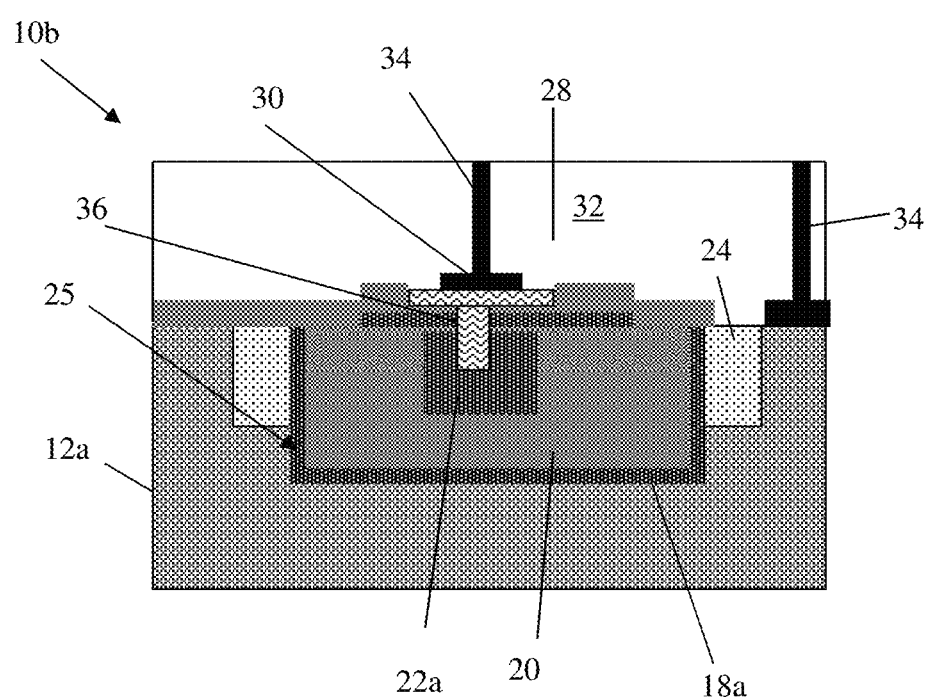
FIG. 9 shows a photodiode in accordance with yet additional aspects of the present disclosure.

FIG. 9 shows a photodiode in accordance with additional aspects of the disclosure. In the structure 10b of FIG. 9, the photodiode 25 includes a different film stack arrangement (e.g., P-I-P-N), compared to that described with reference to FIGS. 1-8. In particular, the substrate 12a, the semiconductor material 18a and the semiconductor material 22a are P-type semiconductor materials; whereas, the semiconductor material 20 remains an intrinsic semiconductor material (non-doped) formed by an epitaxial growth process on the semiconductor material 18a.

In this embodiment, though, the semiconductor material 22a will not completely fill the remaining portion of the trench. Instead, an N-type semiconductor material 36 will be epitaxially grown on the semiconductor material 22a. Alternatively, the semiconductor material 22a can be grown to completely fill the remaining portion of the trench, followed by a lithography and etching process to form a trench in a central portion thereof. The trench can then be filled with the N-type semiconductor material 36 by epitaxially growing on the semiconductor material 22a. A silicide contact 30 is formed directly on a top surface of the photodiode 25, e.g., semiconductor material 36, with a contact 34 is formed to the silicide contacts 30 as described with reference to FIG. 7. This arrangement is also suitable for backside illumination. It should also be understood that front-side illumination may also be practiced using this configuration (e.g., by using a polySi contact and no silicidation over the detector).

Figure 10A:
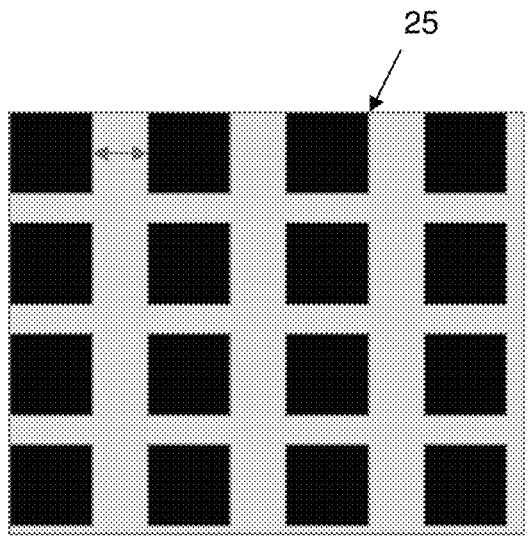
FIGS. 10A and 10B show different arrays of photodiodes in accordance with aspects of the present disclosure.
Figure 10B:
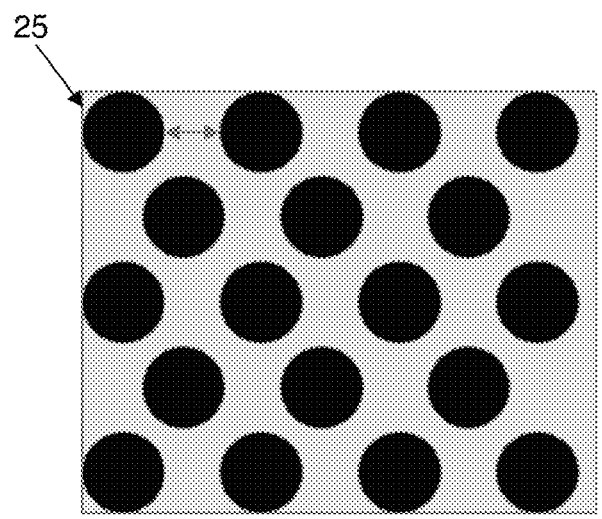

FIGS. 10A and 10B show different arrays of photodiodes in accordance with aspects of the present disclosure. More specifically, FIG. 10A shows an array of quadrilateral (e.g., square or rectangular) photodiodes 25 and FIG. 10B shows an array of circular photodiodes 25. Although the array of quadrilateral (e.g., square or rectangular) photodiodes 25 are provided in alignment with one another, they can be in other formats. In addition, it is noted that the array of circular photodiodes 25 are more densely packed together than the quadrilateral (e.g., square or rectangular) photodiodes 25, e.g., 18 photodiodes vs. 16 photodiodes.

Figure 11:
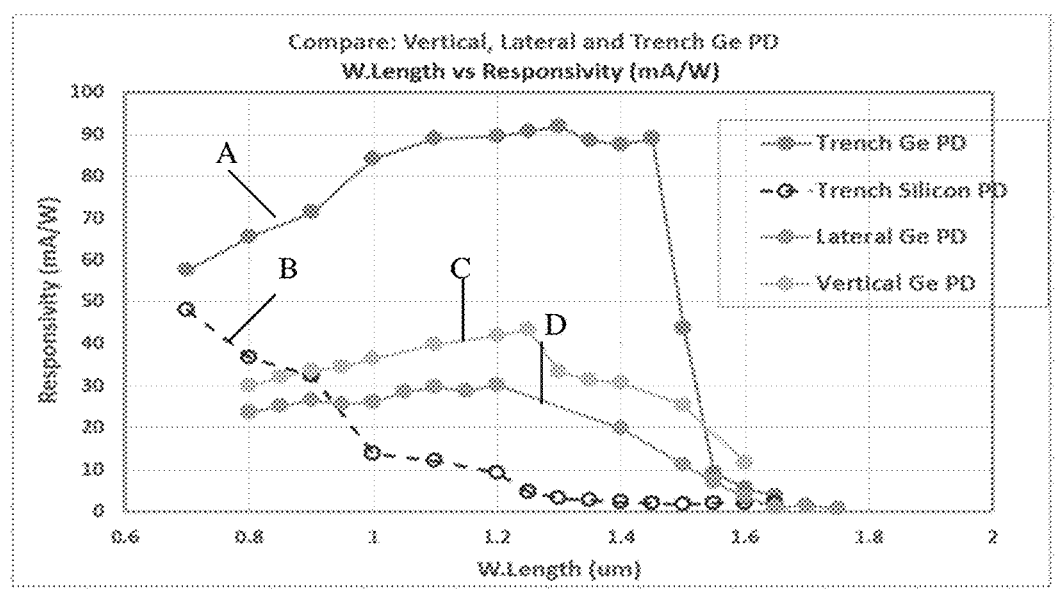
FIG. 11 is a comparison graph show responsivity of the photodiodes of the present disclosure and conventional systems in which the photon path is only two dimensional, e.g., from top to bottom (vertical) or one side to another side (lateral).

FIG. 11 is a comparison graph show responsivity of the photodiodes of the present disclosure and conventional systems in which the photon path is only two dimensional, e.g., from top to bottom (vertical) or one side to another side (lateral). In the graph, the x-axis is wavelength (μm) and the y-axis is responsivity (mA/W). Line "A" represents a photodiode with Ge material and line "B" represents a photodiode with Si material, both of which have a three dimensional (3D) path in accordance with aspects of the disclosure; whereas, line "C" represents a photodiode with Ge material with a pathway only in the lateral direction and line "C" represents a photodiode with Ge material with a pathway only in the vertical direction. As clearly shown from the graph, responsivity is greatest for both the photodiode of lines "A" and "B" at a wavelength of approximately 0.7 μm. Moreover, the Ge implementation shown in line "A" is far superior than any other implementation throughout a wavelength of about 1.5 μm.

The avalanche photodiode can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a substrate material having a trench with sidewalls and a bottom;
    a first semiconductor material lining the sidewalls and the bottom of the trench;
    a photosensitive semiconductor material provided on the first semiconductor material; and
    a second semiconductor material comprising a plug in a center of the photosensitive semiconductor material and extending onto a top surface of the photosensitive semiconductor material.

2. The structure of claim 1, further comprising isolation structures comprising oxide material extending into the substrate material and surrounding the trench, remote from the photosensitive semiconductor material and the oxide material being spaced away from the photosensitive semiconductor material and the second semiconductor material.

3. The structure of claim 1, further comprising isolation structures comprising reflective material that reflects photons into the first semiconductor material lining the sidewalls and the bottom of the trench.

4. The structure of claim 1, wherein the photosensitive semiconductor material comprises intrinsic material and the second semiconductor material extends only partially onto the top surface of the photosensitive semiconductor material.

5. The structure of claim 4, therein the intrinsic material comprises undoped Ge material and the second semiconductor material is spaced away from an edge of the trench and the substrate material.

6. The structure of claim 4, wherein the substrate material comprises N-type semiconductor material, and the first semiconductor material and the second semiconductor material comprise P-type semiconductor material.

7. The structure of claim 6, wherein the second semiconductor material comprises a P+ plug to bias operation of an avalanche photodiode.

8. The structure of claim 7, further comprising a semiconductor material on the P+ plug and a masking material over the semiconductor material to prevent silicide formation on the P+ plug.

9. The structure of claim 8, wherein the P+ plug comprises unsilicided material and a contact is formed on a side of the trench, electrically contacting the substrate to detect a signal.

10. The structure of claim 7, further comprising silicide and a contact on the P+ plug.

11. The structure of claim 3, further comprising a third semiconductor material on the second semiconductor material, all of which are within the trench, wherein the substrate material, the first semiconductor material and the second semiconductor material comprise P-type materials and the third material comprises N-type material.

12. The structure of claim 11, further comprising a silicide contact and a contact in electrical connection to the N-type semiconductor material.

13. A structure, comprising:
    a semiconductor substrate;
    a trench formed in the semiconductor substrate, the trench having sidewalls and a bottom;
    a semiconductor material having a first dopant type which lines the sidewalls and the bottom of the trench;
    an intrinsic photosensitive semiconductor material contacting the semiconductor material;
    a second semiconductor material having the first dopant type and which is in the trench and contacting the intrinsic photosensitive semiconductor material; and
    an isolation structure comprising reflective material surrounding the trench, and remotely positioned from the intrinsic photosensitive semiconductor material, wherein the intrinsic photosensitive semiconductor material comprises undoped Ge material and the second semiconductor material is a plug comprising sidewalls and a bottom surface that are in contact and surrounded by the intrinsic photosensitive semiconductor material, and outer sidewalls of the intrinsic photosensitive semiconductor material are devoid of the second semiconductor material.

14. The structure of claim 13, wherein the semiconductor substrate comprises N-type material and the first dopant type comprises P-type material, and further comprising a masking material over the second semiconductor material to prevent silicide formation on the second semiconductor material.

15. The structure of claim 13, wherein the semiconductor substrate comprises N-type material and the first dopant type comprises P-type material, and further comprising a silicide contact directly on the second semiconductor material.

16. The structure of claim 13, further comprising a N-type semiconductor material directly on the second semiconductor material within the trench, wherein the semiconductor material and the second semiconductor material are P-type materials and the intrinsic photosensitive semiconductor material comprises undoped Ge material.

17. The structure of claim 13, further comprising a silicide contact and a contact in electrical connection to the semiconductor material, wherein the isolation structure comprises oxide material, and the second semiconductor material is only partially on a top surface of the intrinsic photosensitive semiconductor material such that it is not contacting the isolation structure and is separated by the isolation structure.

18. The structure of claim 13, wherein the trench is circular or quadrilateral in cross section.

19. A method comprising:
forming a trench in a substrate;
providing a liner of semiconductor material on sidewalls and a bottom of the trench;
forming an undoped photosensitive material on the semiconductor material partially within the trench;
forming a second semiconductor material on the undoped photosensitive material filling a remaining portion of the trench, wherein the second semiconductor material is formed partially on a top surface of the undoped photosensitive material on an outside of the trench; and
forming trench structures with reflective oxide based material in the substrate adjacent to the liner of the semiconductor material and remote from the second semiconductor material
wherein the undoped photosensitive material comprises undoped Ge material and the second semiconductor material is a plug comprising sidewalls and a bottom surface that are formed in contact and surrounded by the undoped photosensitive material, and outer sidewalls of the undoped photosensitive material are devoid of the second semiconductor material.

* * * * *